(12) United States Patent
Janke

(10) Patent No.: US 7,084,021 B2
(45) Date of Patent: Aug. 1, 2006

(54) METHOD OF FORMING A STRUCTURE WHEREIN AN ELECTRODE COMPRISING A REFRACTORY METAL IS DEPOSITED

(75) Inventor: Paul Janke, Northridge, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/797,202

(22) Filed: Mar. 9, 2004

(65) Prior Publication Data

US 2004/0180520 A1   Sep. 16, 2004

Related U.S. Application Data

(60) Provisional application No. 60/454,905, filed on Mar. 14, 2003.

(51) Int. Cl.
*H01L 21/338* (2006.01)
*H01L 21/28* (2006.01)
*H01L 21/44* (2006.01)

(52) U.S. Cl. .................. 438/167; 438/172; 438/574

(58) Field of Classification Search ............... 438/167, 438/172, 585, 574, 578, 579, 618, 951
See application file for complete search history.

(56) References Cited

U.S. PATENT DOCUMENTS 5,739,557 A    4/1998  O'Neil, II et al. .......... 257/192
5,766,967 A *  6/1998  Lai et al. .................... 438/167
6,255,035 B1 * 7/2001  Minter et al. ............... 438/579

OTHER PUBLICATIONS

Wolf et al., Silicon Processing for the VLSI ERA, : Process Technology, 1986, Lattice Press, vol. 1, p. 384.*
Suemitsu, T. et al., "Improved Recessed-Gate Structure For Sub-0.1-μm-Gate InP-Based High Electron Mobility Transistors," *Jpn. J. Appl. Phys.*, vol. 37, Part 1, No. 38, pp. 1365-1372 (Mar. 1998).

(Continued)

*Primary Examiner*—Walter L. Lindsay, Jr.
(74) *Attorney, Agent, or Firm*—Ladas & Parry LLP

(57) ABSTRACT

The presently disclosed technology provides a method for forming a structure wherein an electrode, such as a gate, comprising a refractory metal is deposited. The method comprises depositing a plurality of electron sensitive resist layers on the substrate. Several of the resist layers used have properties that allow them to maintain their shape when exposed to the temperatures needed to deposit refractory metals. Using electron beam lithography, several regions are defined in the resist layers that will be removed to create a mold for a gate. By using resist layers which maintain their shape when exposed to the temperatures needed for evaporating a refractory metal, the mold defined in the resist layers will maintain its shape, thereby allowing a gate having a mushroom shape to be formed.

31 Claims, 9 Drawing Sheets

OTHER PUBLICATIONS

Tanenbaum, D.M., et al., "High Resolution Electron Beam Lithography Using ZEP-520 and KRS Resists at Low Voltage," *J. Vac. Sci. Technol. B*, vol. 14, No. 6, pp. 3829-3833 (Nov./Dec. 1996).

"ZEP Series: Positive Tone, Chemically Amplified Type For Device Fabrication," *Zeon Corporation* INTERNET: <http://www.zeon.co.jp/products/imagelec2c2.html> 1 page total (2002).

"ZEP520" *Zeon Corporation* INTERNET: <http://www.zeon.co.jp/> Version 1.02, pp. 1-11 (Mar. 2001).

\* cited by examiner

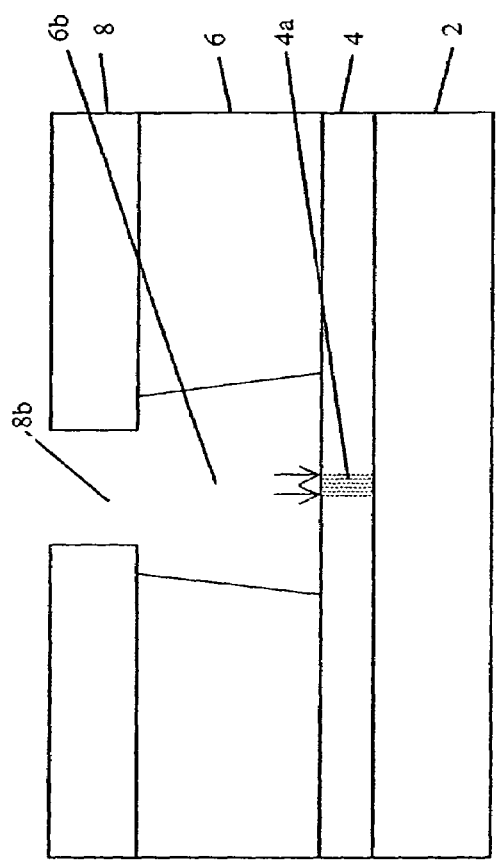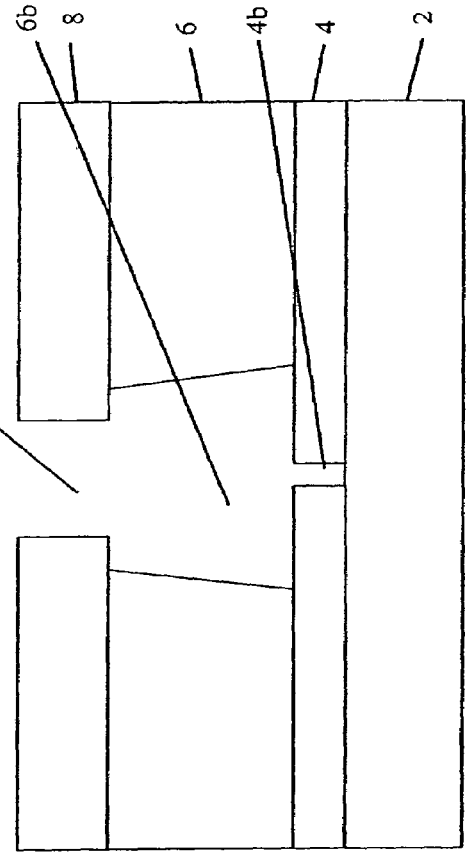
Fig. 2c
Fig. 2d

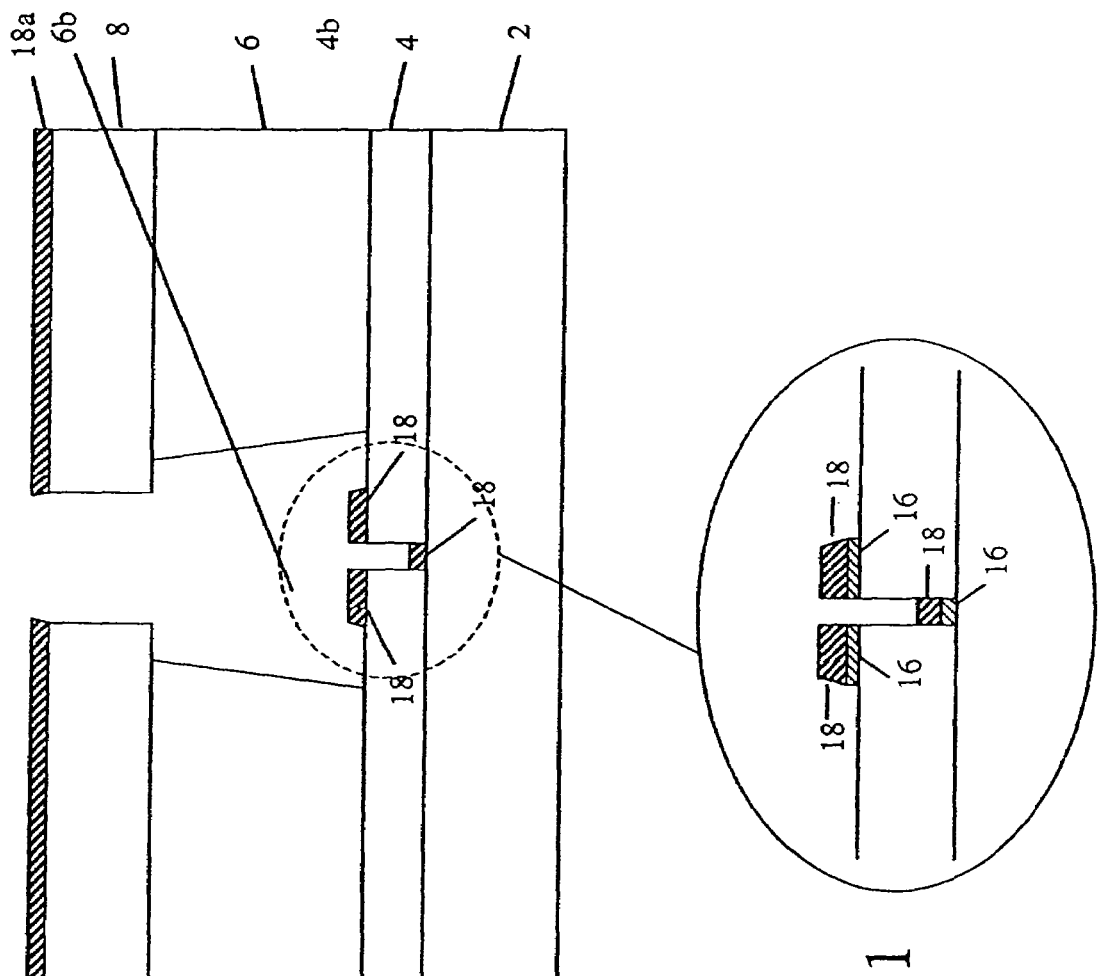

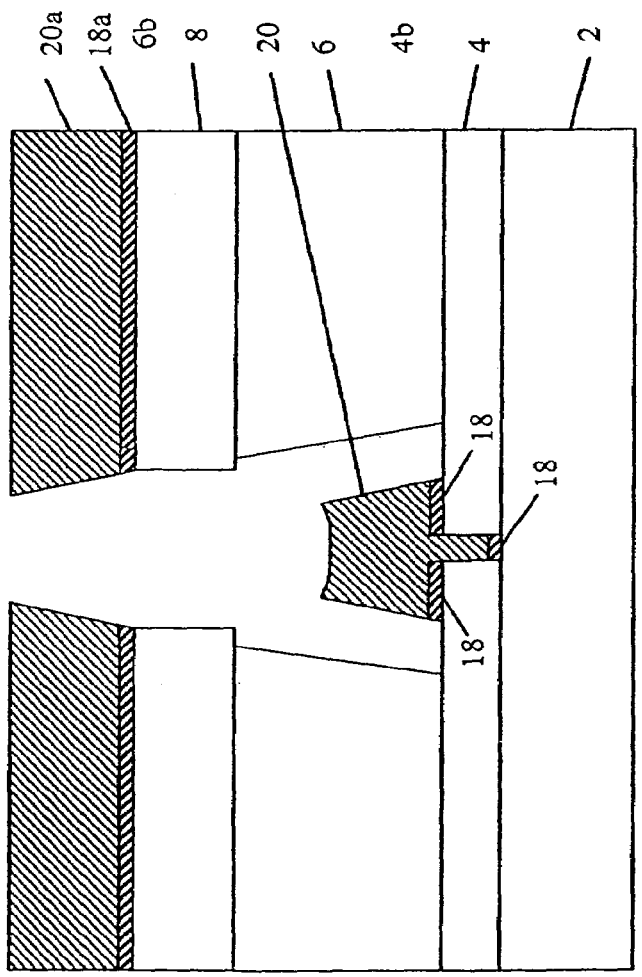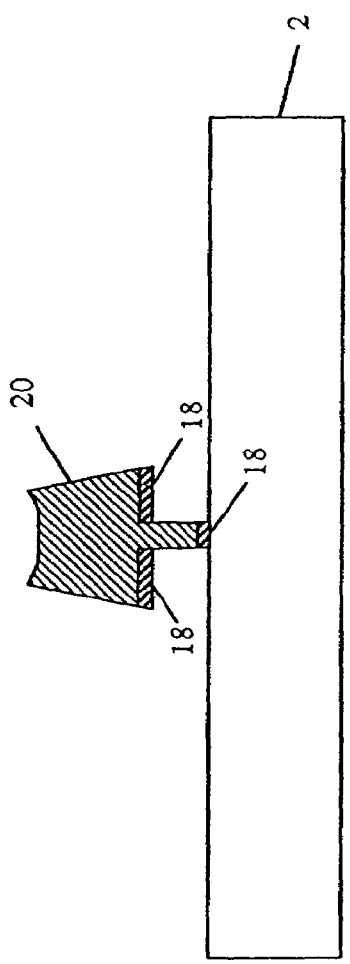
Fig. 3b
Fig. 3c

METHOD OF FORMING A STRUCTURE WHEREIN AN ELECTRODE COMPRISING A REFRACTORY METAL IS DEPOSITED

CROSS REFERENCE TO A RELATED APPLICATION

This application claims the benefit of U.S. Provisional Patent Application 60/454,905 filed Mar. 14, 2003, the disclosure of which is hereby incorporated herein by reference.

TECHNICAL FIELD

The presently disclosed technology relates to a method for forming a structure wherein a gate comprising a refractory metal is deposited. More specifically, the presently disclosed technology relates to a method for forming a structure wherein a gate comprising a refractory metal, and having a mushroom shape is deposited.

BACKGROUND

Previously, attempts have been made at forming mushroom shaped gates of field effect transistors using refractory metals. Mushroom shaped gates typically have a large cross-sectional area to reduce resistance, while the portion of the gate contacting the substrate remains small to reduce capacitance. As a result, transistors with mushroom shaped gates have desirable high-frequency and low-noise characteristics. Typically, mushroom shaped gates are fabricated by forming a mold in several electron sensitive resist layers, wherein metal for the gate could be deposited. However, these resist layers would generally deform if a refractory metal was deposited because of the high temperatures needed to deposit refractory metals, rendering the attempt unsuccessful. As a result, metals such as aluminum and copper are commonly used in the industry because they can be evaporated at a temperature sufficiently low, so that the resist is unaffected. One disadvantage of not using a refractory metal is that high temperature processing cannot be performed after forming the gate. Typical non-refractory gate metals include gold, aluminum, and copper. After the gate has been formed using one of these metals, the metal may diffuse into the substrate if exposed to high temperature processes. These high temperatures are not necessarily the melting point of the metal, but merely high enough to allow the metal to diffuse into the substrate. In addition, gates with these metals have a tendency to diffuse into the substrate over extended periods of time, even without the presence of high temperatures. However, by depositing a refractory metal between the gate and the substrate, the diffusion problem can be avoided.

Prior attempts at incorporating a refractory metal have been attempted, but resulted in complicated techniques. U.S. Pat. No. 5,739,557 O'Niel, LL, et al., "Refractory Gate Heterostructure Field Effect Transistor," teaches the fabrication of a HFET using a refractory metal gate and a refractory ohmic contact. However, the fabrication scheme disclosed does not allow a metal lift-off step to remove the resist after the gate is formed. This significantly complicates the process. This fabrication scheme requires the use of dielectric deposition and etching techniques which add complexity to device processing and limit its use to materials which are compatible with these techniques. A similar non-lift-off refractory gate fabrication scheme is discussed in T. Suemitsu et al. in Jpn. J. Appl. Phys. Vol. 37 (1998) Pt. 1 No. 3B pp. 1365–1372. Suemitsu describes the fabrication of a refractory metal sub 0.25 micron gate using multiple dielectric layers with multiple reactive ion etching steps and sputtered metal films in a non-lift-off process. As with O'Niel, LL, et al., this technique requires the use of dielectric deposition and etching techniques which add complexity to the process.

As a result, there is a need for a simple process in which a structure is fabricated, wherein a gate comprising a refractory metal can be deposited, followed by removal of resists and extraneous metals using a simple lift-off process.

SUMMARY

The presently disclosed technology addresses the aforementioned needs by providing a method for forming a structure wherein a gate comprising a refractory metal is deposited. The applicant has experimentally determined that a commercially available resist marketed as having a high resistance to reactive ion etching may also have the necessary properties needed to prevent resist deformation during exposure to the high temperatures needed for refractory metal deposition.

Accordingly, in one aspect of the presently disclosed technology, a substrate is provided and a plurality of electron sensitive resist layers are deposited over the substrate. Two layers in the plurality of resist layers will not deform when exposed to the high temperatures needed for refractory metal deposition. Using electron beam lithography, specified regions in the resist layers are defined. The defined regions are then developed to remove the defined regions from the resist layers, thereby creating a mold in which a gate can be deposited. If desired, a recess can be etched into the substrate. A refractory metal is then deposited in the mold on the substrate followed by a gate contact to form the gate. After the gate is formed, a lift-off process is used to remove the plurality of resist layers.

In another aspect of the presently disclosed technology, a plurality of alignment markers are preferably deposited on the substrate surface to help more accurately define an area in resist layers in which a mold is formed. Because of the thickness and characteristics of the plurality of resist layers, it is necessary to expose and remove through development an area above and around the alignment markers to provide for accurate pattern registration. The alignment markers preferably comprise ohmic metal and are exposed by removing the portion of the resist layers directly above and around the alignment markers. The electron beam machine then uses the alignment markers as a reference point for exposing the regions of the resist layers where the mold is to be formed.

BRIEF DESCRIPTION OF THE DRAWINGS

FIGS. 1a–1d show a cross section of the deposited resist layers on the substrate;

FIGS. 1a-1 and 1a-2 show a top view of the substrate with the alignment markers;

FIG. 1e shows the defined regions above the alignment markers;

FIG. 1f shows the defined regions above and around the alignment markers removed;

FIG. 2a shows a cross section of the defined regions in the second and third resist layers;

FIG. 2b shows a cross section of the defined regions in FIG. 2a removed from the second and third resist layers;

FIG. 2d-1 shows a recessed region formed in the substrate;

FIG. 3a shows a cross section of molybdenum deposited in the gate contact region and gate foot region;

FIG. 3a-1 shows a cross section of an enlarged version of FIG. 3a;

FIG. 3b shows a cross section of gold deposited on the molybdenum; and

FIG. 3c shows a cross section of the gate after lift-off.

DETAILED DESCRIPTION OF THE DISCLOSED TECHNOLOGY

The presently disclosed technology will now be described more fully hereinafter with reference to the accompanying drawings, in which preferred embodiments of the technology are shown. This presently disclosed technology may be embodied in many different forms and should not be construed as limited to the embodiments set forth herein.

The presently disclosed technology provides a method for forming a structure wherein a metal electrode (such as a gate of a field effect transistor) comprising a refractory metal is deposited. Accordingly, a substrate is provided, whereon first, second, and third resist layers are sequentially deposited. The first and third resist layers are able to maintain their shape when exposed to the high temperatures needed to deposit the refractory metal. The second resist layer may show some deformation when exposed to high temperatures, however, because it is sandwiched between the first and third resist layers, it will generally be able to maintain its shape when exposed to high temperatures. The second resist layer should, however, be of a viscosity so as to allow it to form a layer thicker than either the first or third resist layers to be applied. Electron beam lithography is then used to define regions in the resist layers, which define a mold. The defined gate regions are removed from the resist layers using developer to create the mold. If desired, a recess can be etched into the substrate. Then, using metal evaporation, a refractory metal is deposited in the mold followed by a gate contact.

Figure 1A:
Figure 1B:
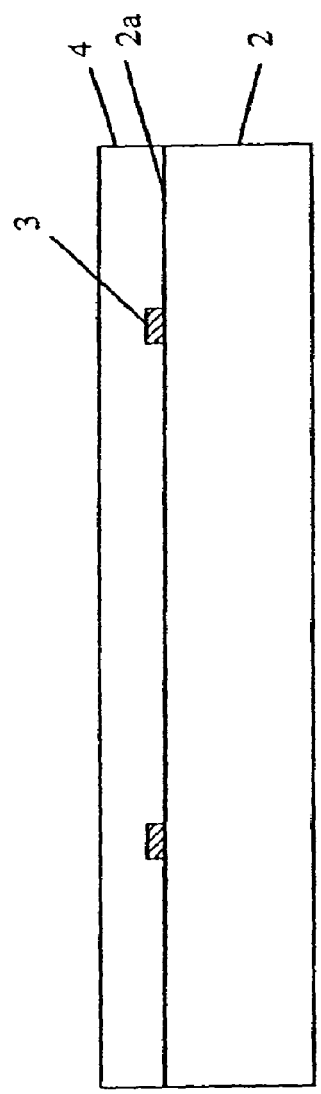

A preferred embodiment is now described with reference to FIGS. 1–3c. In this preferred embodiment a substrate 2 is provided, as shown in FIG. 1a. The substrate 2 may comprise a series of epitaxially deposited layers of group III–V materials such as InP and GaN and preferably has alignment markers 3 (discussed later) outlining a square or triangular shape on the surface 2a of the substrate 2 as shown in FIGS. a-1 and a-2. The substrate 2 is preferably pre-baked at 180° C. for two minutes to ensure that the surface 2a of the substrate 2 is dry. After pre-baking, a first electron sensitive resist layer 4 is spin coated over the surface 2a and the alignment markers 3 at a suitable speed, such as 5000 RPM, to obtain a desired thickness of about 2000 Å, as shown in FIG. 1b. The first resist layer 4 preferably comprises the resist sold under the tradename ZEP520-12 by the Zeon Corporation of Tokyo, Japan. After deposition, the first resist layer 4 is baked at about 180° C. for about 30 minutes. This helps solidify the first resist layer 4 after deposition and ensures that it has a smooth surface. A resist such as ZEP520-12 is preferred because it can maintain its shape when exposed to temperatures up to 180° C., which is necessary for the deposition of refractory metals such as molybdenum.

Figure 1C:
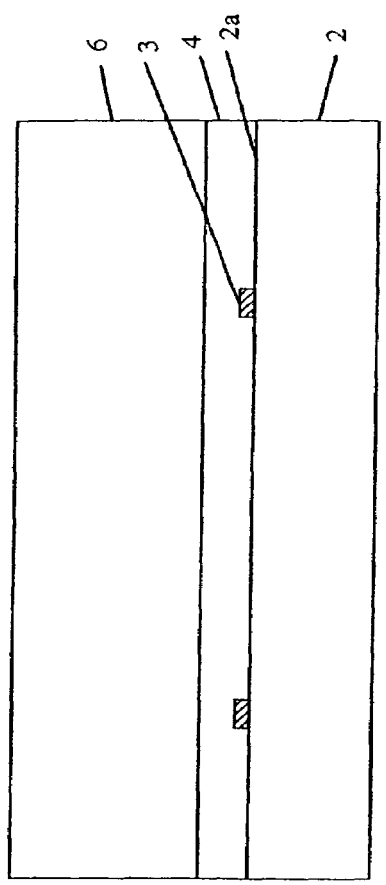

Next, a second electron sensitive resist layer 6 is spin coated over the surface of the first resist layer at a suitable speed, such as 2500 RPM, to obtain a desired thickness of about 7000 Å, as shown in FIG. 1c. The second resist layer 6 preferably comprises the resist sold under the tradename MMA(17.5)-MAA EL11 by the MicroChem Corporation of Newton, Mass. A resist such as the aforementioned EL11 is preferred for the second resist layer because it has a sufficiently high viscosity to allow a layer about 7000 Å thick to be deposited. Such a thick layer is needed in order to create a second region 6a (see FIG. 2a) in which a gate contact region (discussed later) can be formed. Unlike ZEP520-12 though, the second resist need not be as resilient to high temperatures. However, because the second resist layer is sandwiched between the first and third resist layers 4, 8, it will generally not deform when exposed to high temperatures. Furthermore, it is not as critical for the gate contact to retain the contours of the mold, as it is for the gate foot and gate opening (discussed later), which are defined by the first and third resist layers 4, 8. After deposition, the second resist layer 6 is baked at about 180° C. for about 30 minutes to help solidify the second resist layer 6 and ensure a smooth surface.

Figure 1D:
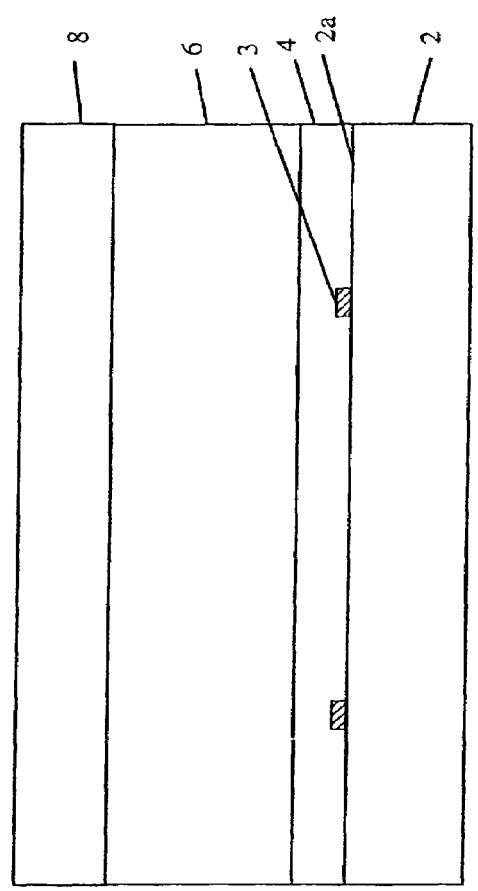

A third electron sensitive resist layer 8 is then spin coated over the second resist layer 6 at a suitable speed, such as 5000 RPM, to obtain a thickness of about 3000 Å, as shown in FIG. 1d. The third resist layer 8 preferably comprises the resist sold under the tradename ZEP520-22 by the Zeon Corporation of Tokyo, Japan. A resist such as ZEP520-22 is preferred for the third resist layer 8 because it can maintain its shape at temperatures up to about 180° C. which are needed for the deposition of a refractory metal, such as molybdenum. Furthermore, ZEP520-22, which is similar to ZEP520-12, is far more sensitive to electron exposure during electron beam lithography than ZEP520-12, the consequences of which are discussed later.

After the third layer of resist 8 has been applied, electron beam lithography is used to define regions in the resist layers 4, 6, 8 which will be removed to create a mold for the gate. In a first exposure, the portion of the resist layers 4, 6, 8 immediately above and in a 50 micron square region around the alignment markers 3 is removed. As aforementioned, the alignment markers 3 are preferably deposited on the substrate 2 in a square pattern or triangular pattern (see FIGS. 1a-1 and 1a-2). The alignment markers 3 shown in FIGS. 1a-1 and 1a-2 have not been drawn to scale, but are depicted for illustrative purposes only. The alignment markers 3 have two purposes: 1) they outline the area (indicated by the dashed lines) which will be further processed to define a mold; and 2) they serve as a reference point for the electron beam machine during subsequent processing steps. As the electron beam machine scans over the resist layers 4, 6, 8, it emits a signal. The alignment markers reflect the signal back to the electron beam machine to indicate to the electron beam that it is above an alignment marker 3, thereby serving as a reference point. The alignment markers 3 comprise an ohmic metal and preferably have dimensions that are about 20 $\mu m^2$. The spacing between alignment markers 3 mapping out an area is preferably about 10 mm. To remove the resist layers 4, 6, 8 directly above and around the alignment markers 3, data including the distance between the alignment markers 3, and the shape used by the alignment markers 3 to map out an area (triangular, square) are provided to the electron beam machine. The electron beam machine then scans over the substrate surface 2a and emits an electron beam with energy of about 300 $\mu C/cm^2$ when above the alignment markers 3 to define regions in the resist layers 4, 6, 8, as shown in FIG. 1*e*. These regions are typically about 50 μwide. The substrate 2 is then developed in a suitable resist developer, such as 100% Methyl iso-Butyl Ketone (MIBK), for about 60 seconds to remove the defined regions in the resist layers 4, 6, 8, as shown in FIG. 1*f*.

Figure 1F:
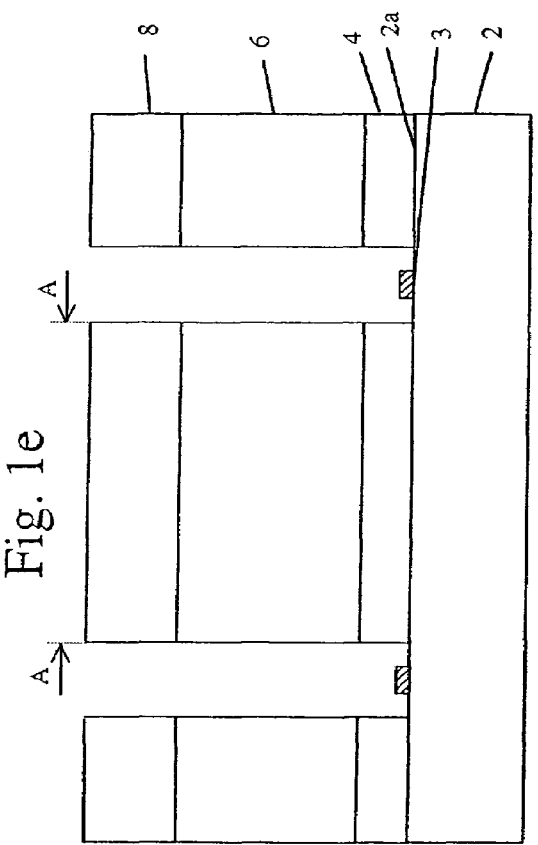
Figure 2A:
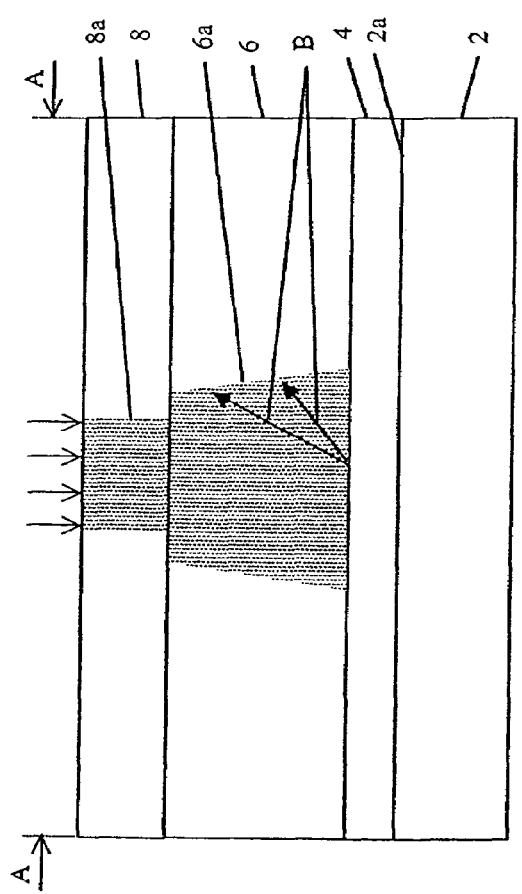
FIG. 2c shows a cross section of the defined region in the first resist layer.
FIG. 2d shows a cross section of the defined region in FIG. 2c removed from the first resist layer.

The resist layers 4, 6, 8 then undergo a second exposure which defines a third region 8*a* in the third resist layer 8 and a second region 6*a* in the second resist layer 6 shown in FIG. 2*a*. Note the cross section depicted by arrows A in FIG. 2*a* and the cross section depicted by arrows A in FIG. 1*f*. The third region 8*a* is used to define a gate opening region and the second region 6*a* is used to define a gate contact region. To define the second and third regions 6*a*, 8*a*, the second exposure is performed by impinging electrons with an energy in the range of 38–45 $\mu C/cm^2$ onto the exposed surface of the third resist layer 8. The electrons impinging on the surface of the third resist layer 8 define an area, for example, of about 0.4 microns wide, by using the alignment markers 3 as reference points. Defining an area about 0.4 microns wide is generally known to those skilled in the art, and can be performed by adjusting the electron beam spot size, electron beam stepping distance, and computer aided design defined dimension of the electron beam machine. Once such electron beam machine that could be used is the Leica EBPG4V available from Leica Microsystems. The emitted electrons travel through the resist layers 4, 6, 8 towards the surface 2*a* of the substrate 2 in a direction orthogonal to the surface 2*a*. When the emitted electrons hit the surface 2*a* they are reflected back through the resist layers 4, 6, 8. However, some of the reflected electrons reflect at an angle off of their incident angle as is figuratively depicted by arrows B in FIG. 2*a*. Shown in FIG. 2*a* is the third region 8*a* in the third resist layer 8, and the second region 6*a* in the second resist layers 6. However, there is no region defined in the first resist layer 4 by the electrons. The reason for this is that ZEP520-12 is far less sensitive to electrons than EL11 or ZEP520-22, and is essentially unaffected by electrons having energy in the range of 38–45 $\mu C/cm^2$.

The second region 6*a* in the EL11 is significantly larger than the third region 8*a* in the ZEP520-12, and has a trapezoidal shape. This is due to the fact that electrons from the second exposure are reflected off the surface 2*a* at angles off of the incident angle, and enter the second resist layer 6. The portion of the second resist layer 6 nearest the surface 2*a* receives the bulk of the reflected electrons, while the portion of the second resist layer 6 nearest the third resist layer 8 receives fewer reflected electrons, and those reflected electrons have less energy. As a result, the second region 6*a* generally has a cross-sectional shape which is wider at the boundary of the first resist layer 4 than it is at the boundary with the third resist layer 8. Thus, the shape is somewhat trapezoidal in cross section. It is possible for the third region 8*a* to receive some reflected electrons. However, because the third region 8*a* is farthest from the surface 2*a*, the reflected electrons received by the third region 8*a* will be significantly less in quantity and in energy. As a result, the third region 8*a* may be slightly widened in the portion of the second region 8*a* nearest the surface 2*a*, but in practice, the portion of the third region 8*a* on the side away from region 6*a* will not be widened significantly.

Figure 2B:
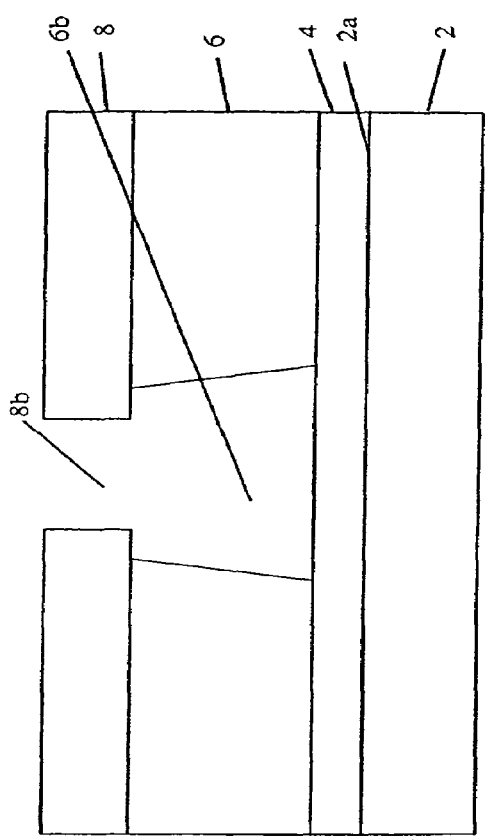

The third region 8*a* in the third resist layer 8 is then developed in a suitable resist developer, such as solution of 100% MIBK, for a suitable period of time, such as 360 seconds. This removes the resist in the third region 8*a* from the third resist layer 8, as shown in FIG. 2*b*, thereby forming a gate opening region 8*b*. Next, the second region 6*a* in the second resist layer 6 is developed in a suitable resist developer, such as a solution of one part Ethylene glycol monoethyl ether acetate (EGMEA): five parts Ethanol (ETOH) for a suitable period of time, such as 45 to 70 seconds. This removes the resist in the second region 6*a* from the second resist layer 6, thereby forming a gate contact region 6*b*.

Next, a third exposure is used to define a first region 4*a* in the first resist layer 4, as shown in FIG. 2*c*. The first region 4*a* is used to define a gate foot region (discussed below), which will be the region where the gate contacts the substrate 2. Using electron beam lithography, a beam of electrons having energy of about 800 $\mu C/cm^2$ is directed at the surface of the first resist layer 4 in an area of, for example, about 0.05 microns wide. Defining an area about 0.05 microns wide is known to those skilled in the art and can be performed by adjusting the electron beam spot size, electron beam stepping distance, and computer aided design defined dimension of the electron beam machine. It is worth noting that the energy used in this third exposure is greater than the energy used in the second exposure by a factor of roughly 20. ZEP520-12 used in the first resist layer 4 is significantly less sensitive to electrons than EL11 used in the second resist layer 6 or ZEP520-22 used in the third resist layer 8. The impinging electrons from the third exposure on the surface of the first resist layer 4 define a first region 4*a* that is about 0.05 microns wide.

Figures 1, 2D:
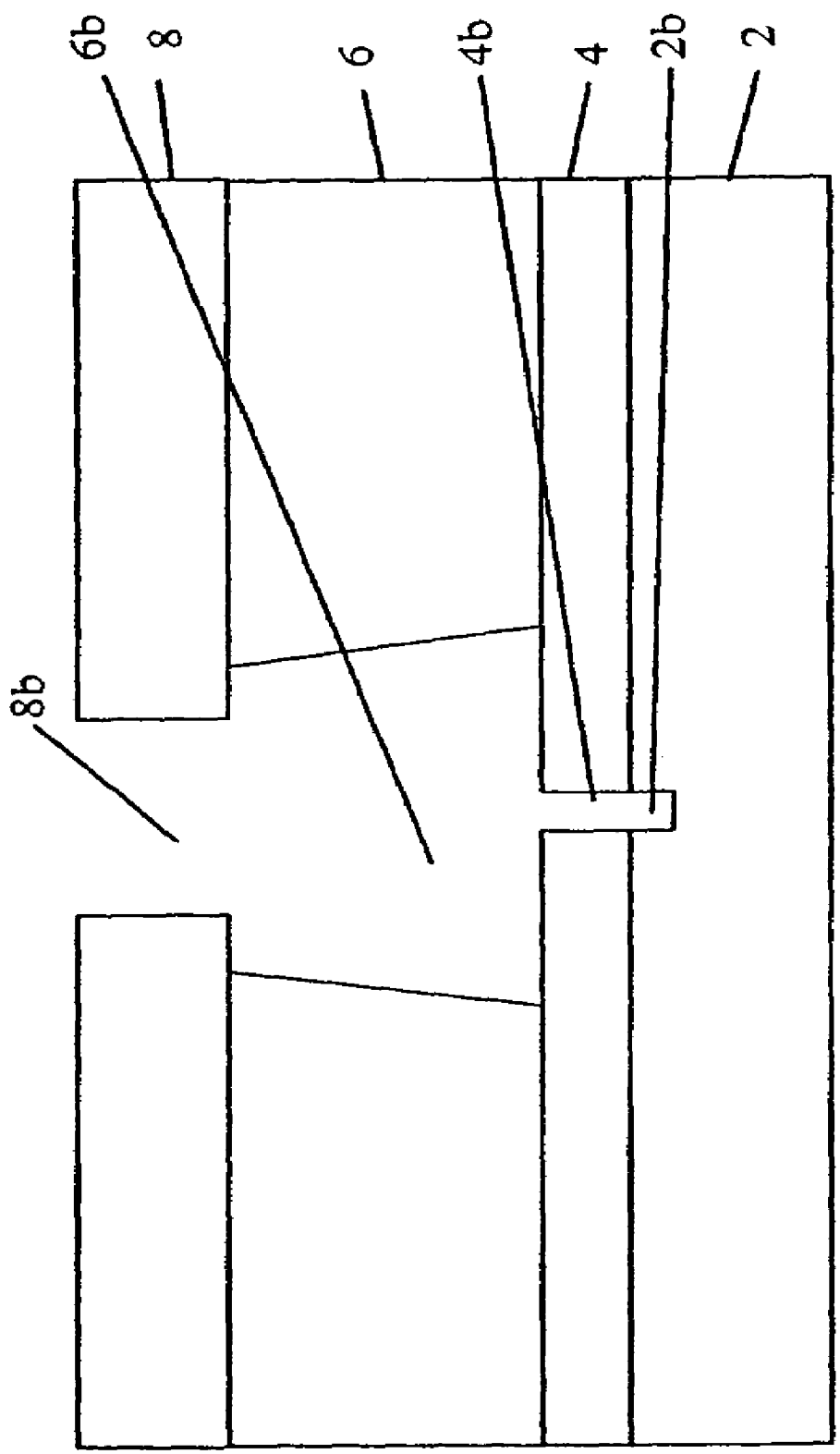

The first region 4*a* in the first resist layer 4 is then developed in a suitable resist developer, such as a solution of one part MIBK: two parts iso-propyl alcohol (IPA), for a suitable period of time, such as 60–90 seconds, thereby forming a gate foot region 4*b* shown in FIG. 2*d*. When the electrons hit the surface 2*a* of the substrate 2, they can reflect back through the first resist layer 4 and enter the second and third resist layers 6, 8. However, the developer used to remove the third region 4*a* in the first resist layer 4 does not affect the second and third resist layers 6, 8. The gate foot region 4*b* is noticeably smaller than the gate contact region 6*b*, in order to define a mushroom shape. This will allow the subsequently deposited gate to assume a mushroom shape, which is preferably because of the desirable electrical characteristics a mushroom shaped gate provides. Providing a gate with a mushroom shape will help reduce intrinsic capacitance between the gate and the substrate 2, and will help reduce resistance between the gate and another electrode contacting the gate. However, those skilled in the art, will realize that the presently disclosed technology may also be used to form structures wherein electrodes having a geometry other than a mushroom shape are deposited.

Figures 1, 1A, 2:
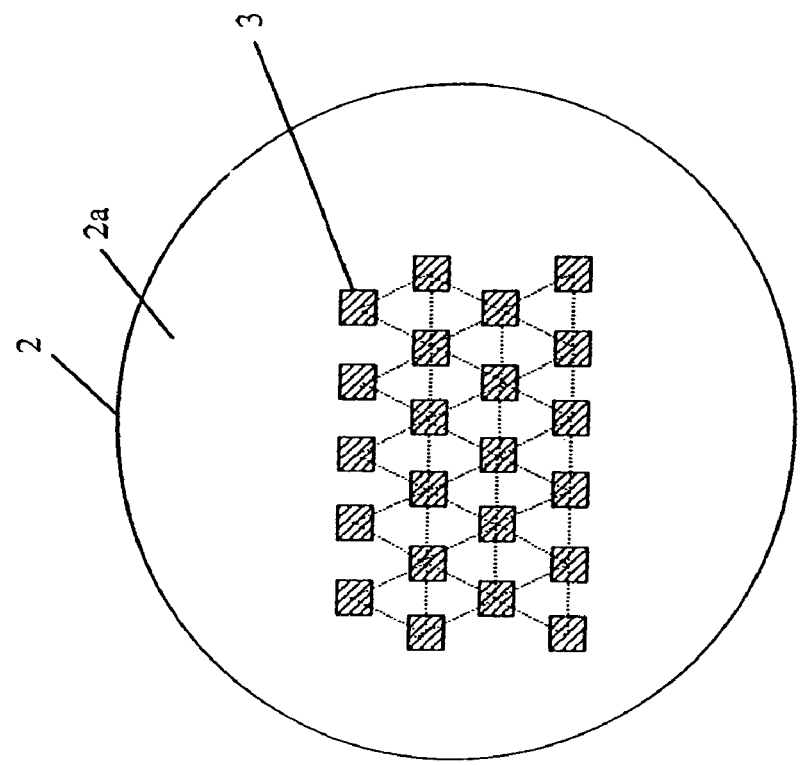
Figures 1, 1A:
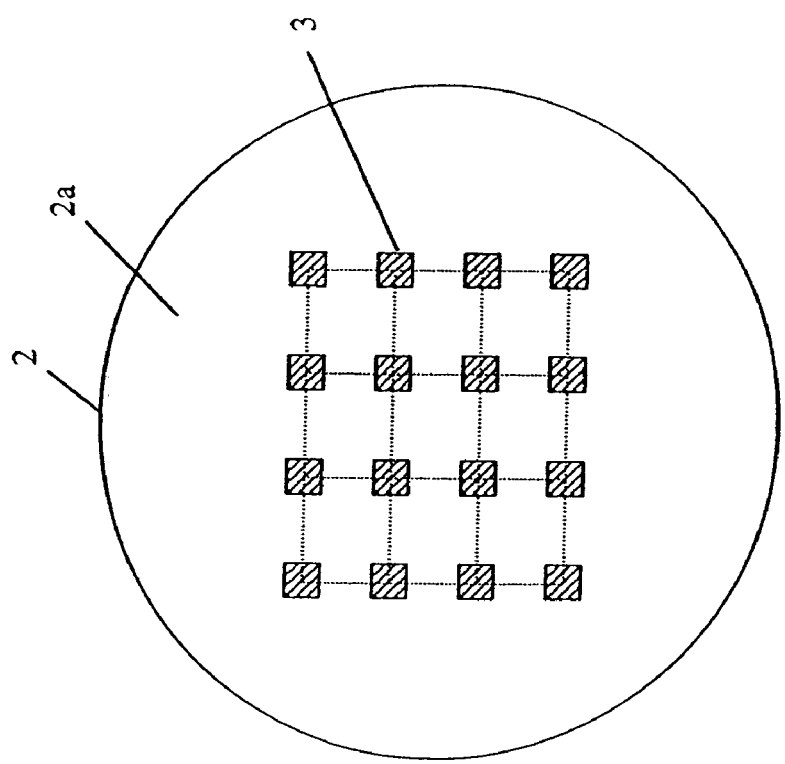
Figure 1E:
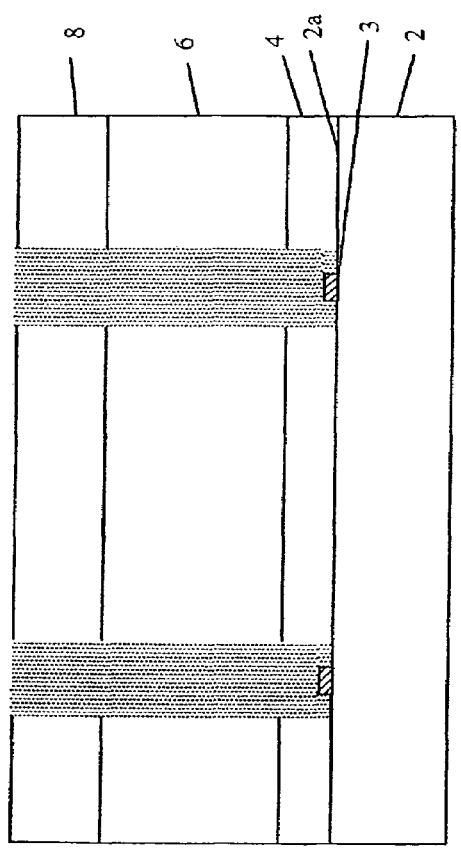

Optionally, after forming the gate foot region 4*b*, a recessed region 2*b* may be formed in the substrate 2, as shown in FIG. 2*d*-1. Those skilled in the art will realize that there are a variety of wet etches and dry etches which could be used to create the recessed region 2*b* in the substrate 2 using the existing resist layers 4, 6, 8 as a mask. Forming a gate in the recessed region 2*b* may help to improve the breakdown voltage characteristics of the device.

The gate contact region 6*b* and gate foot region 4*b* are then used as a mold wherein a metal gate will be formed using metal evaporation. Using the gate opening 8*b* as an entry point, metal for the gate is deposited in the gate contact region 6*b* and gate foot region 4*b*. Because the gate opening 8*b* defines the areas within the gate contact region 6*b* and gate foot region 4*b* which are covered with metal, it is important that the shape of the gate opening 8*b* does not change as a result of high temperatures. In depositing the metal, first an optional adhesion layer 16, shown in FIG. 3*a*-1, preferably approximately 20 Å thick, may be deposited in the gate foot region 4b on the surface 2a, and in the gate region 6b on the surface of the first resist layer 4 around the gate foot region 4b. The adhesion layer 16 preferably comprises titanium and helps promote adhesion of the gate to the surface 2a of the substrate. Also, in performing such a step, an extraneous adhesion layer (not shown) about 20 Å thick will also form on the exposed surface of the third resist layer 8, but will eventually be removed during the liftoff process (discussed later).

Next, a refractory metal layer 18 preferably about 400 Å thick is deposited on top of the adhesion layer (if deposited) in the gate foot region 4b and in the gate region 6b on the surface of the first resist layer 4 around the gate foot region 4b, as shown in FIG. 3a. The refractory metal layer 18 may comprise, for example, molybdenum or tungsten and can be deposited using a variety of known techniques, such as evaporation. An extraneous refractory metal layer 18a also forms on the surface of the extraneous adhesion layer (if deposited). When the refractory metal layer 18 comprises molybdenum, for example, the temperature of the metal that forms in the mold is around 180° C. It is important that the gate foot region 4b maintain its shape during the deposition of the refractory metal layer 18. Electrical characteristics of the gate such as breakdown voltage and intrinsic capacitance are governed by the dimensions of the metal in the gate foot region 4b contacting the substrate 2. As a result, the gate foot region 4b must be able to maintain its shape in the first resist layer 4 during the metal evaporation of the adhesion layer 16 and refractory metal layer 18 in order to provide a gate foot with the desired dimensions.

Finally, a gate contact 20 having a thickness preferably about 4000 Å thick is deposited on the refractory metal layer 18 as shown in FIG. 3b. Gold is preferably used in the metal contact layer 18 because of its low resistance characteristics. The purpose of the refractory metal layer 18 is to prevent the gate contact 20 from diffusing into the substrate 2 during subsequent high temperature processing. For example, gold, which has a melting point around 1065° C., can still diffuse into the substrate 2 at room temperature. On the other hand, molybdenum, which has a melting point around 2620° C., will generally not diffuse into the substrate 2. In addition, it is also possible for the gate contact 20 to diffuse into the substrate 2 over time. The refractory metal layer 18 helps prevent this problem, thereby increasing the life span of the device. Those skilled in the art will realize that a gate having other dimensional parameters could be easily fabricated by using the aforementioned technique.

Once all the metal layers 16 (if used), 18, and 20 have been applied, a lift-off process is performed to remove the remaining portions of the resist layers 4, 6, 8 by preferably using a solution of 1-methyl-2-pyrrolidinone (NMP) at 35° C. for 30–60 minutes, thereby leaving the gate contact 20 on the substrate 2, as shown in FIG. 3c.

Those skilled in the art should appreciate that the aforementioned techniques can be applied to fabricate other types of metal electrodes, such as an emitter contact electrode for a heterojunction bipolar transistor or such as interdigitated electrodes for a metal-semiconductor photodetector, a photoconductive switch or a capacitor.

Various other alternative embodiments and/or modifications can be devised by those skilled in the art without departing from the spirit of this disclosure. Accordingly, the disclosed technology is intended to embrace all such alternatives, modifications, and variances that fall within the scope of the appended claims.

What is claimed is:

1. A method of forming a structure wherein a gate electrode comprising a refractory metal is deposited, the method comprising:
   providing a substrate;
   depositing at least a first, a second and a third electron sensitive resist layers over the substrate, the first electron sensitive resist layer being disposed closer to said substrate than are said second and third electron sensitive resist layers, the second electron sensitive resist layer being disposed closer to said substrate than is said third electron sensitive resist layer;
   forming a mold in at least the first, second and third electron sensitive resist layers;
   evaporating the refractory metal in the mold, wherein at least the first and third electron sensitive resist layers in the plurality of electron sensitive resist layers maintain their shape during the step of evaporating the refractory metal in the mold; and
   depositing a high electrical conductivity metal gate contact over the refractory metal, thereby forming the gate electrode.

2. The method of claim 1, wherein the forming of the mold includes exposing the first, second and third electron sensitive resist layers to an electron beam, thereby defining exposed regions in the first, second and third electron sensitive resist layers.

3. The method of claim 2, further comprising developing the exposed regions in the first, second and third electron sensitive resist layers, thereby removing the exposed regions from the first, second and third electron sensitive resist layers and thereby creating the mold.

4. The method of claim 3, wherein the first and third electron sensitive resist layers are less sensitive to the electron beam than is the second electron sensitive resist layer.

5. The method of claim 4, wherein the middle electron sensitive resist layer has a viscosity that allows the second electron sensitive resist layer to be at least 7000 Å thick.

6. The method of claim 1, wherein the refractory metal is selected from a member of the group consisting of tungsten and molybdenum.

7. The method of claim 1, wherein the plurality of electron sensitive resist layers are exposed to temperatures up to approximately 180° C. during the evaporation of the refractory metal.

8. The method of claim 1, wherein the mold defines a mushroom shape.

9. The method of claim 8, further comprising the step of lifting off the plurality of electron sensitive resist layers after the step of depositing the gate contact.

10. A method of forming a structure wherein an electrode comprising a refractory metal is deposited, the method comprising the steps of:
   providing a substrate having a plurality of alignment markers;
   depositing a first, a second and a third electron sensitive resist layer over the substrate and the alignment markers;
   removing the portions of the plurality of electron sensitive resist layers above and around the alignment markers;
   forming a mold in the plurality of electron sensitive resist layers using the alignment markers as reference points; and
   evaporating the refractory metal in the mold, the first and third electron sensitive resist maintaining their respective shapes during evaporation of the refractory metal.

11. The method of claim 10, wherein forming of the mold includes exposing the first, second and third electron sensitive resist layers to an electron beam, thereby defining exposed regions in the first, second and third electron sensitive resist layers.

12. The method of claim 11, further comprising developing the exposed regions in the first, second and third electron sensitive resist layers, thereby removing the exposed regions from the first, second and third electron sensitive resist layers and thereby creating the mold.

13. The method of claim 12, wherein the first electron sensitive resist layer is located nearer the substrate than are either the second or third electron sensitive resist layers and the third electron sensitive resist is located further from the substrate than are either the first or second electron sensitive resist layers.

14. The method of claim 10, wherein the refractory metal is selected from a member of the group consisting of tungsten and molybdenum.

15. The method of claim 14, wherein the first and third electron sensitive resist layers are each less sensitive to the electron beam than is the second electron sensitive resist layer.

16. The method of claim 15, wherein the second electron sensitive resist layer has a viscosity that allows the middle electron sensitive resist layer to be at least 7000 Å thick.

17. The method of claim 10, wherein the plurality of electron sensitive resist layers are exposed to temperatures up to 180° C. during evaporation of the refractory metal.

18. The method of claim 10, further comprising depositing a high electrical conductivity metal gate contact over the refractory metal, thereby forming a gate electrode.

19. The method of claim 18, further comprising lifting off the first, second and third electron sensitive resist layers after the gate contact has been deposited.

20. The method of claim 10, wherein the mold defines a mushroom shape.

21. The method of claim 10, wherein the alignment markers comprise an ohmic metal.

22. A method of forming a structure wherein an electrode including a refractory metal is formed, the method comprising:
    providing a substrate;
    depositing a plurality of electron sensitive resist layers on the substrate, the plurality of electron sensitive resist layers comprising an electron sensitive resist layer nearest the substrate, an electron sensitive resist layer farthest from the substrate, and a intermediate electron sensitive resist layer formed between the electron sensitive resist layer nearest the substrate and the electron sensitive resist layer farthest from the substrate;
    forming a mold in at least the intermediate electron sensitive resist layer and in at least the electron sensitive resist layer nearest the substrate, the mold defining a mushroom shape;
    evaporating the refractory metal in the mold, wherein the electron sensitive resist layer nearest the substrate and the electron sensitive resist layer farthest from the substrate maintain there shape during the evaporation of the refractory metal; and
    depositing a gate contact over the refractory metal, thereby forming a gate.

23. The method of claim 22, wherein formation of the mold includes exposing the plurality of electron sensitive resist layers to an electron beam, thereby defining exposed regions in the plurality of electron sensitive resist layers.

24. The method of claim 23, further comprising developing the exposed regions in the plurality of electron sensitive resist layers, thereby removing the exposed regions from the plurality of electron sensitive resist layers and thereby creating the mold.

25. The method of claim 24, wherein the electron sensitive resist layer nearest the substrate and the electron sensitive layer farthest from the substrate are less sensitive to the electron beam than the intermediate electron sensitive resist layer.

26. The method of claim 25, wherein the intermediate electron sensitive resist layer has a viscosity which allows the intermediate electron sensitive resist layer to be at least 7000 Å thick.

27. The method of claim 22, wherein the refractory metal is selected from a member of the group consisting of tungsten and molybdenum.

28. The method of claim 22, wherein the plurality of electron sensitive resist layers are exposed to temperatures up to 180° C. during the step of evaporating a refractory metal.

29. The method of claim 22, further comprising lifting off the plurality of electron sensitive resist layers after the depositing the gate contact.

30. The method of claim 1, wherein the at least the first and third electron sensitive resist layers maintain their shape during the step of evaporating the refractory metal in the mold when exposed to temperatures up to 180° C.

31. The method of claim 22, wherein the electron sensitive resist layer nearest the substrate and the electron sensitive resist layer farthest from the substrate maintain there shape during the evaporation of the refractory metal when exposed to temperatures up to 180° C.

* * * * *